United States Patent [19]

Smith

[11] Patent Number: 5,503,299
[45] Date of Patent: Apr. 2, 1996

[54] INERTIAL PARTS FEEDING APPARATUS AND METHOD

[75] Inventor: Nathan R. Smith, Stillwater, Minn.

[73] Assignee: Advantek, Inc., Minnetonka, Minn.

[21] Appl. No.: 276,521

[22] Filed: Jul. 18, 1994

[51] Int. Cl.⁶ .................................................. B65G 47/26
[52] U.S. Cl. .................. 221/186; 221/197; 221/200; 221/289; 414/415; 198/459.1
[58] Field of Search .................................. 414/415, 416; 198/459.1, 459.6; 221/186, 190, 197, 200, 204, 289, 294, 301; 29/759

[56] References Cited

U.S. PATENT DOCUMENTS

| | | | |
|---|---|---|---|
| 4,952,109 | 8/1990 | Hendricks | 414/415 |
| 5,116,185 | 5/1992 | Lofstedt | 414/415 |
| 5,154,316 | 10/1992 | Holcomb et al. | 414/415 |
| 5,183,181 | 2/1993 | Sugai | 221/301 |
| 5,337,465 | 8/1994 | Tamaki et al. | |

FOREIGN PATENT DOCUMENTS

| | | | |
|---|---|---|---|
| 3-273477 | 12/1991 | Japan | 221/197 |
| 275975 | 7/1968 | U.S.S.R. | 221/301 |

Primary Examiner—H. Grant Skaggs
Attorney, Agent, or Firm—Burd, Bartz & Gutenkauf

[57] ABSTRACT

An inertial parts feeding apparatus and method for dispensing parts, such as microchips, onto a moving belt. The feeding apparatus has a housing supporting an elongated tube accommodating the microchips. A guide mounted on the housing aligns the tube with an arm having an impact shoulder and a microchip stop finger. A roller, engageable with the tube, driven by a stepping motor, moves the tube longitudinally into engagement with the shoulder causing a microchip to move out of the end of the tube and into engagement with the stop finger. The arm is released from the microchip during the time that the tube moves back to its initial position to allow the microchip to move with the belt.

41 Claims, 7 Drawing Sheets

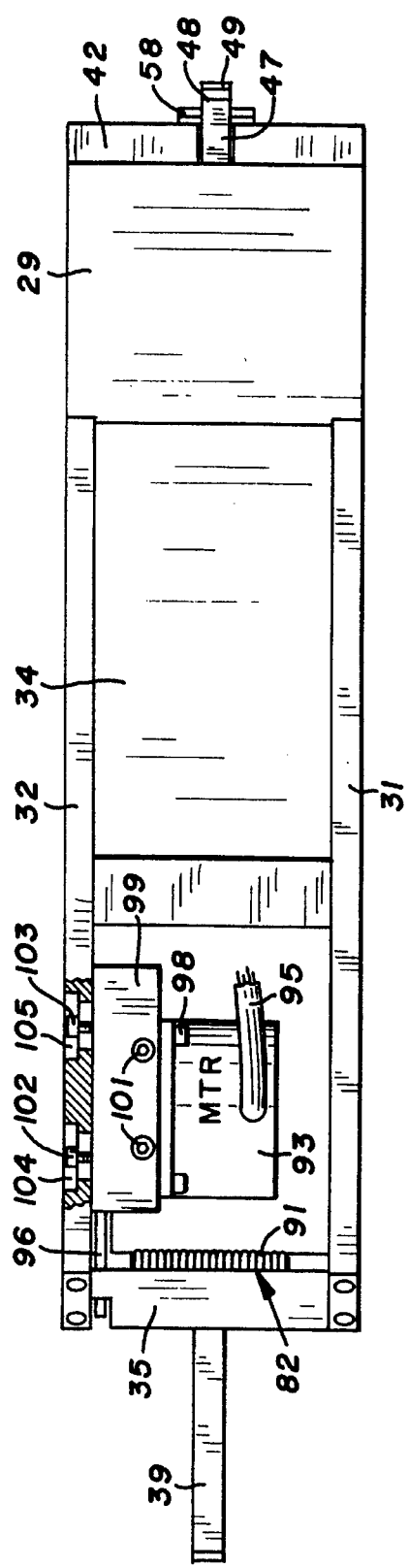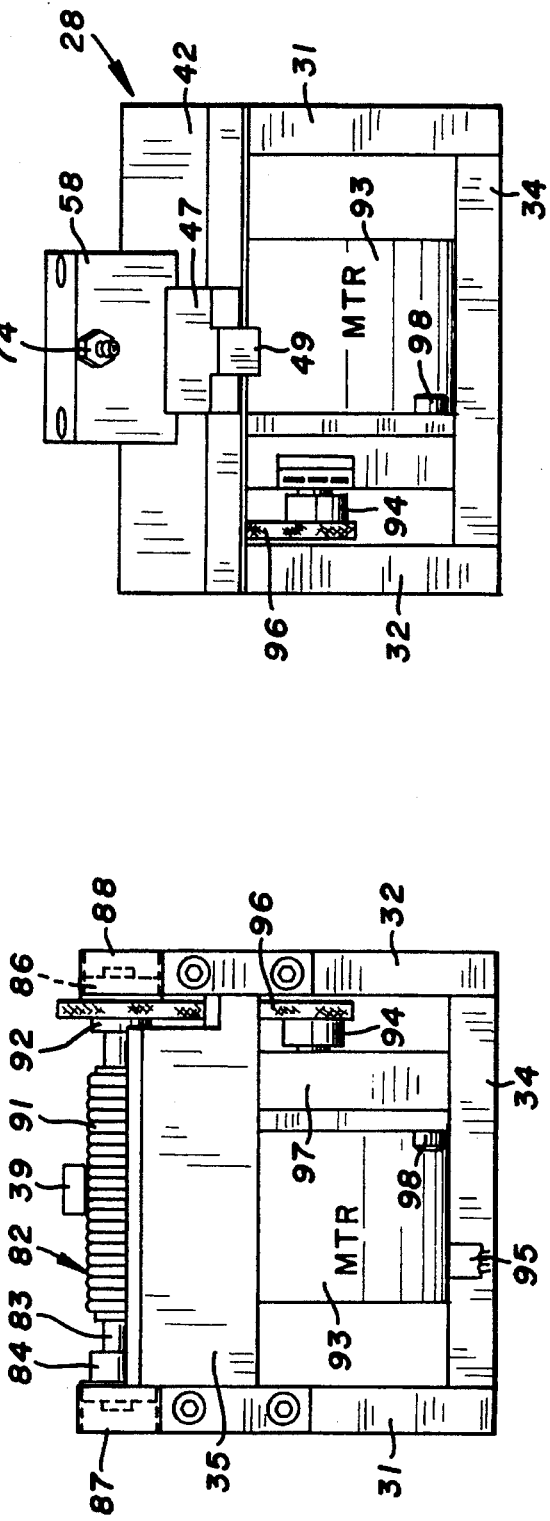
FIG. 4
FIG. 5
FIG. 6

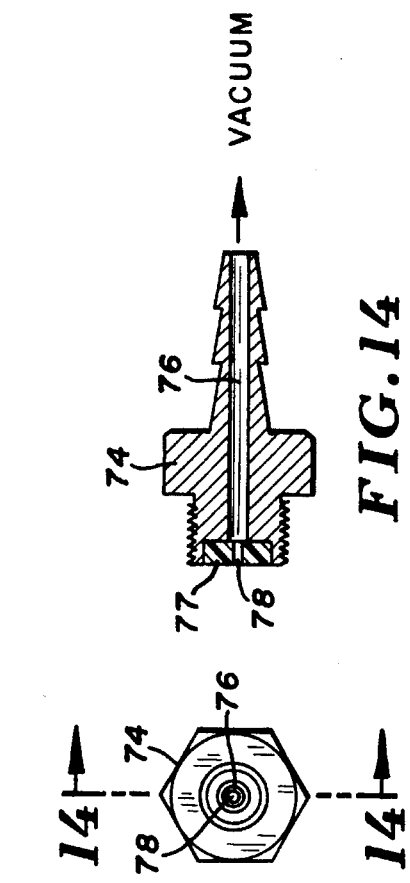
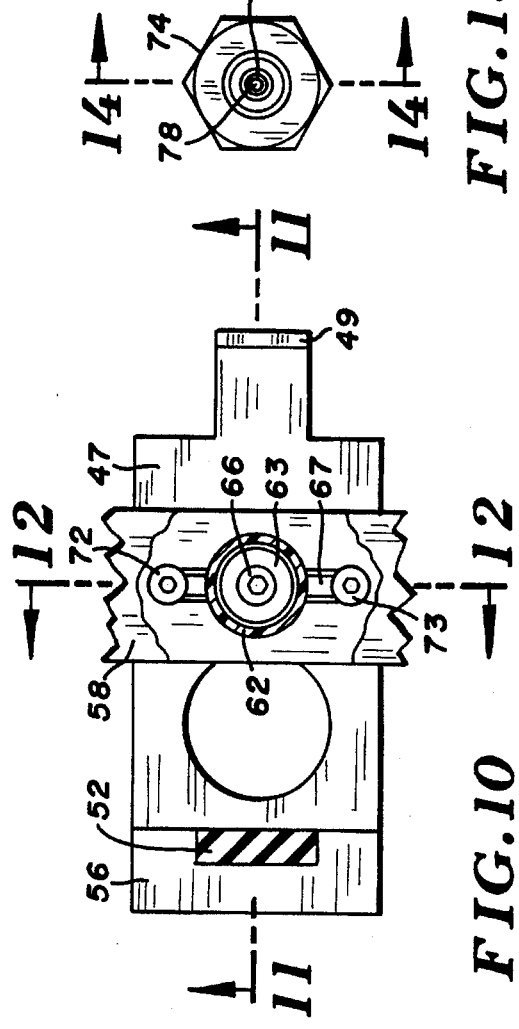
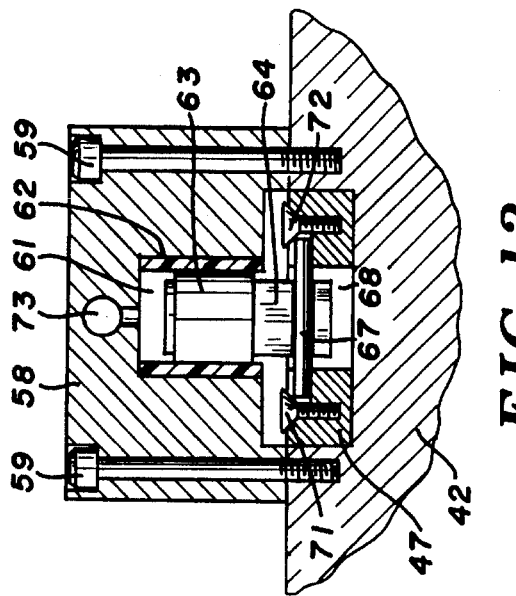
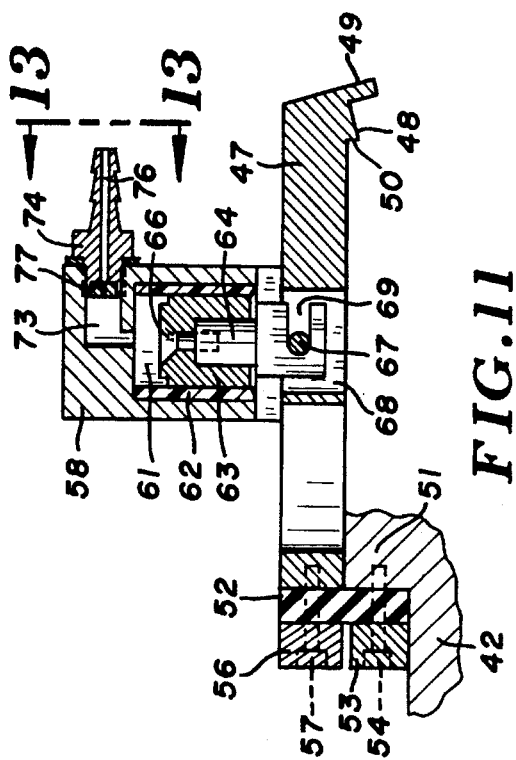

INERTIAL PARTS FEEDING APPARATUS AND METHOD

FIELD OF INVENTION

The invention relates to machines and methods for dispensing individual parts onto a receiver such as a moving belt. The machine operates to sequentially dispense microchips onto a moving belt for subsequent handling, testing and processing.

BACKGROUND OF THE INVENTION

Microchips are stored and shipped in elongated tubes. Each microchip must be removed from an open end of a tube and placed on a receiver, such as a moving belt, for subsequent handling, testing and processing. There are several methods that are in current use to dispense microchips from tubes and sequentially place microchips on a receiver, such as a moving belt. One method of removing microchips from a tube is to tilt the tube at an angle to allow the microchips to slide out of the lower open end of the tube. A movable stop adjacent the open end of tube controls the suggillation of the microchips on a moving belt. This method is not suitable for small microchips and can cause damage to microchips. Another method used to handle microchips from a tube is to incline the tube to allow microchips to slide out of the open lower end of the tube. A pair of driver wheels associated with an optical sensor are located adjacent the open end of the tube. The sensor activates the wheels when a microchip is adjacent the wheels whereby the wheels simultaneously rotate to move the microchip onto a moving belt. This structure consumes considerable space and is difficult to accommodate different sized microchips. An additional method is known as a vibration method. One or more structures grip the tube and retain the tube at a downwardly inclined angle to allow microchips to move out of the open end of the tube. Vibrators acting on the tube cause the microchips to fall out of the open lower end of the tube adjacent a device using a vacuum cup that picks up the microchips one-at-a-time and places them on a moving belt. This method does not control the timing or sequence of the dispensing of the microchips from the tubes. The vacuum cup pick-up device does not readily handle small and thin microchips that require precise confinement.

SUMMARY OF THE INVENTION

The invention is directed to an apparatus and method for dispensing parts stored in a tube having an open end onto a receiver. The apparatus has a housing supporting a guide for the tube. An arm movably mounted on the guide has a first stop engageable by the tube whereby the inertia of the parts in the tube results in dispensing of a part onto the receiver and a second stop for retaining a part on the receiver and subsequently allowing the part to move with the receiver. A roller mounted on the housing supports one end of the tube and is operable to move the tube in opposite longitudinal directions. When the tube is moved in a first direction, it impacts against the first stop whereby the inertia of the part causes the first part to move out of the tube onto the receiver. The roller is driven with a power means in an opposite direction to move the tube away from the first stop. An actuator is connected to the arm for moving the arm from a first position to a second position to release the part on the receiver and then move the arm back to the first position to locate the second stop adjacent the receiver for subsequent dispensing of a part from the tube.

One embodiment of the apparatus dispenses microchips stored in an elongated passage in a linear tube having an open end onto a moving member such as belt. The apparatus overcomes the disadvantages of the prior microchip dispensing methods and can gently handle small and thin microchips without damage thereto.

The apparatus has a housing with a forwardly and downwardly inclined top wall. The top wall has an upper end and a lower end. An arm having a shoulder and a stop finger located adjacent the moving member is mounted on a guide for the tube. The guide has a groove for accommodating a portion of the tube adjacent the lower end of the top wall. A yieldable hinge connects the arm to the guide to allow the arm to move from a down, microchip holding position to an up, microchip released position and allow limited longitudinal movement of the arm to absorb part of the impact force of the tube when it impacts against the shoulder. A roller, mounted on the housing, adjacent the upper end of the top wall, engages the tube and supports a portion of the tube above the top wall when a tube is located in the groove of the guide means. A stepping motor, driveably connected to the roller, is operable to selectively rotate the roller in opposite directions, thereby moving the tube in a first direction at a constant acceleration wherein the tube impacts against the shoulder whereby the inertia of the microchips causes the first microchip to move out of the passage onto the moving member. The microchip is retained on the moving member by the stop finger. Rotation of the roller in the opposite direction moves the tube in a second direction away from the shoulder after the microchip has moved out of the tube. A piston and cylinder assembly is used to move the arm from the second position to the first position to release the microchip on the moving member for movement with the moving member and then move the arm from its first position back to the second position to locate the stop finger adjacent the moving member for subsequent dispensing of a microchip on the moving member. The piston and cylinder assembly also hold the arm against the guide to adjust the impact force of the tube on the shoulder. An increase of the pressure on the arm due to the piston and cylinder assembly will increase the impact force generated by the tube as it hits the shoulder. A decrease of the pressure on the arm due to the piston and cylinder assembly reduces the impact force of the tube on the shoulder and allows the hinge to absorb part of the impact force.

The invention also includes the method of dispensing parts, such as microchips, stored in a passage within an elongated tube having an open end onto a moving member, such as belt. The elongated tube is initially positioned in a location with the open end of the tube spaced from the shoulder of the arm. The tube accommodating microchips is then moved from the first position to the second position into impact engagement with the shoulder with a force so that the inertia of a microchip in the passage adjacent the end of the tube causes it to move out of the tube onto the moving member. The velocity of the tube is linearly increased during the movement from the first position to the second position. The acceleration of the tube is constant so that the microchips move with the tube. The microchip on the moving member is retained thereon with the stop finger. Subsequently, the microchip is released for movement with the moving belt by moving the stop finger away from the moving member and microchip. The tube is then moved from its second position back to the first position for subsequent dispensing of a microchip.

DESCRIPTION OF THE DRAWING

FIG. 4 is a bottom plan view thereof;

FIG. 5 is a rear elevational view thereof;

FIG. 6 is a front elevational view thereof;

FIG. 10 is an enlarged top view, partly sectioned, of the part feeding arm of the inertial parts feeding apparatus of FIG. 1;

FIG. 11 is an enlarged sectional view taken along the 11—11 of FIG. 10;

FIG. 12 is an enlarged sectional view taken along the line 12—12 of FIG. 10;

FIG. 13 is an enlarged view taken along the line 13—13 of FIG. 11;

FIG. 14 is a sectional view taken along the line 14—14 of FIG. 13;

DESCRIPTION OF THE PREFERRED EMBODIMENT

Figure 1:
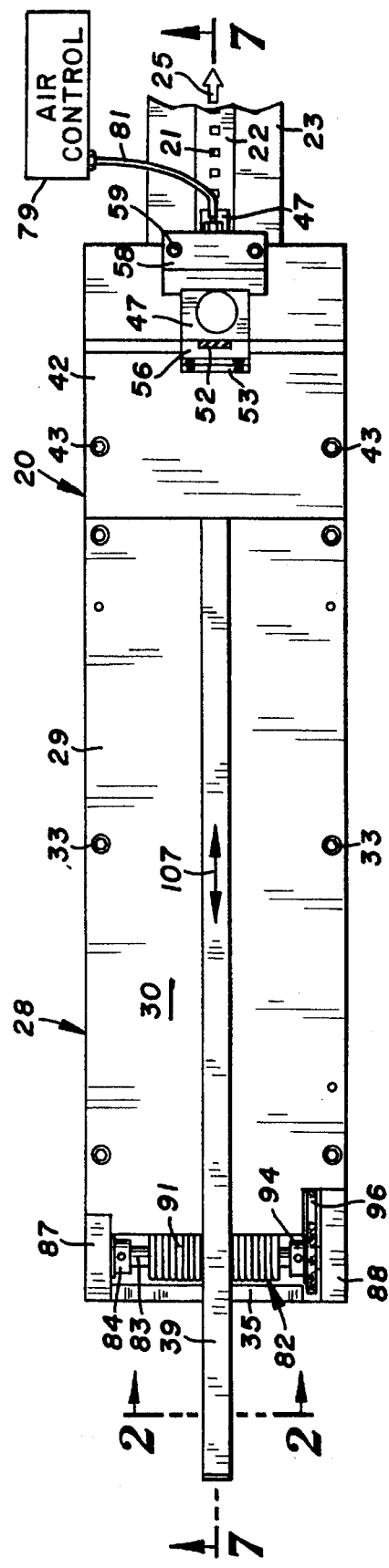
FIG. 1 is a top plan view of the inertial parts feeding apparatus of the invention.
Figure 2:
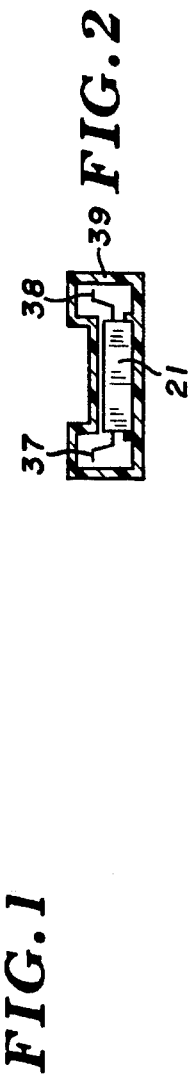
FIG. 2 is an enlarged sectional view taken along the line 2—2 of FIG. 1.

Referring to FIGS. 1 and 2, there is shown an inertial parts feeding apparatus, indicated generally at 20 operable to selectively place parts 21, such as microchips, onto a receiver or moving conveyor belt 22 in predetermined spaced longitudinal sequence as the belt is moved in the direction of arrow 25. Belt 22 slides along the top of a table 23 and is trained about an idler roller 24. Roller 24 is rotatably mounted on upright supports 26 secured to a bottom plate 27. A drive roller, (not shown) associated with the opposite end of the belt, is used to continuously move the belt to carry parts 21 to a location, such as another belt which directs the parts into a testing apparatus (not shown) which operates to test the integrity of the parts. Other types of devices can be used to pick up the parts from belt 22 and move them to another location. The inertial feeding apparatus 20 can be used with other machines that handle, test and assemble parts. The following description of apparatus 20 is for dispensing microchips in sequence onto moving belt 22.

Apparatus 20 has a generally rectangular housing, indicated generally at 28, comprising a downwardly and forwardly inclined top wall 29 joined to upright side walls 31 and 32 with a plurality of fasteners 33. Top wall 29 has an elongated downwardly and forwardly inclined top surface 30. Surface 30 is inclined downwardly from the horizontal at an angle of 5 to 8 degrees. A bottom plate 34, extended between the inside bottom portions of side walls 31 and 32, is connected thereto with fasteners 36, such as bolts. Surface 30 can be horizontal.

Figure 7:
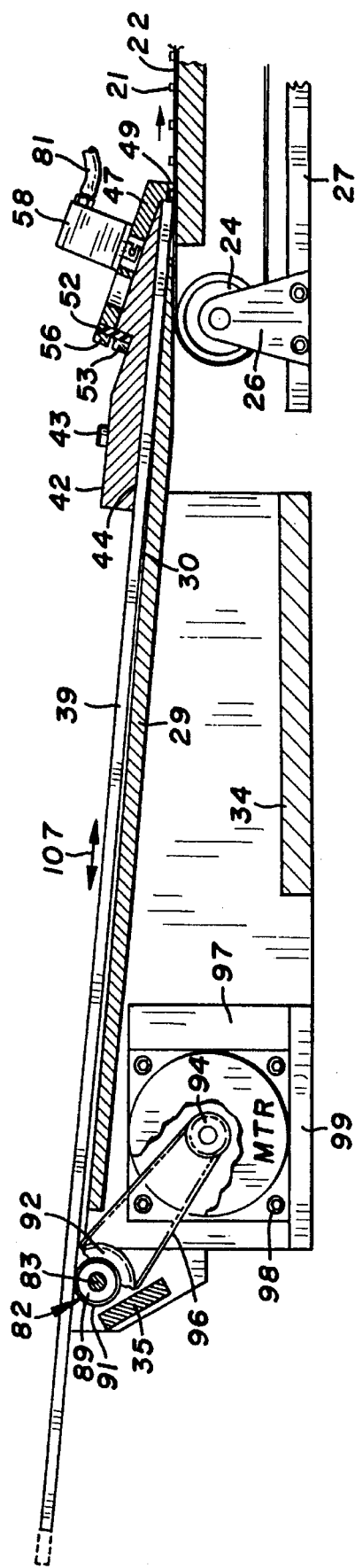
FIG. 7 is a sectional view taken along the line 7—7 of FIG. 1.
Figure 8:
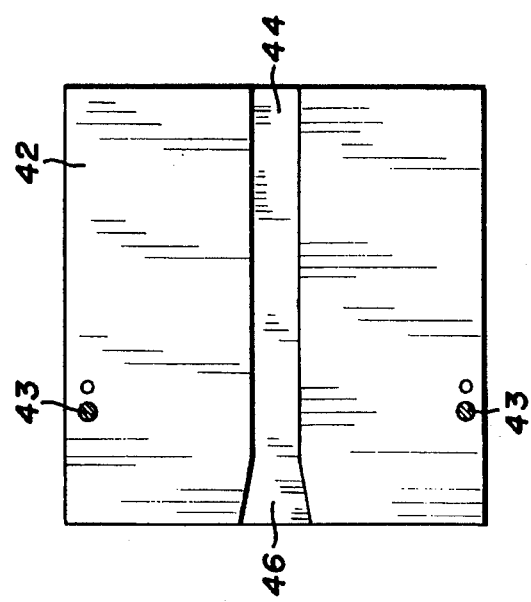
FIG. 8 is an enlarged sectional view taken along the line 8—8 of FIG. 3.

As shown in FIG. 2, part 21 is a microchip having upwardly directed leads 37 and 38 attached to opposite sides of the microchip body. The microchips are stored side-by-side in an elongated linear tube 39. Microchips 21 are free to slide along the length of tube 39 and are deposited one-at-a-time through the open lower end 41 of tube 39 onto conveyor belt 22. Tube 39 extends through a guide plate 42 attached to top wall 29 with bolts 43. As seen in FIGS. 7 and 8, guide plate 42 has an elongated longitudinal groove or channel 44 with a front mouth or enlarged section 46. Tube 39 extends through groove 44 and rests on the top surface 30 forming the bottom wall of groove 44. Groove 44 longitudinally aligns tube 39 with an arm 47. Guide plate 42, being removably secured to top wall 29 with bolts 43, can be removed from housing 28 and replaced with guide plates having different sized grooves to accommodate different tubes storing microchips.

As seen in FIG. 11, arm 47 has a downwardly directed tube stop shoulder 48 and part stop member or finger 49. Shoulder 48 has a downwardly directed front face 50 aligned with the top wall of tube 39. Member 49 projects downwardly and is located rearwardly of tube stop shoulder 48. Arm 47 rests in a longitudinal groove in the top of guide plate 42 and is connected thereto with a yieldable member 52, such as a flat piece of plastic or rubber. Member 52 engages a transverse shoulder 51 of guide plate 42 and is secured thereto with a transverse bar 53 and a plurality of fasteners 54, such as bolts. A second bar 56 engages the upper portion of yieldable member 52 and connects yieldable member 52 with a plurality of bolts to the rear of the arm 47. As shown in FIG. 11, members 53 and 56 are spaced from each other to allow yieldable member 52 to hinge or flex when arm 47 is moved upwardly away from guide plate 42. Yieldable member 52 also allows limited longitudinal movement of arm 47 so as to absorb impact forces subjected to the arm when tube 39 hits shoulder 48 and biases arm 47 in a downward direction into engagement with the top surface of guide plate 42. The friction forces between arm 47 and guide plate 42 adjusts the impact forces applied to shoulder 48 when tube 39 hits shoulder 48. A piston 63, acting on arm 47, forces arm 47 into engagement with guide plate 42. The amount of pressure extended by piston 63 on arm 47 controls the friction forces between arm 47 and guide plate 42.

A housing or bridge 58 spans the mid-section of arm 47 and is attached to guide plate 42 with a plurality of bolts 59, as seen in FIG. 12. Housing 58 has an upwardly directed bore 61 accommodating a cylindrical sleeve 62. A piston 63, slideably located in sleeve 62, is attached a connector 64 with a screw 66. The lower end of connector 64 is coupled to a crossbar 67 located in a hole 68 in the mid-section of arm 47. As shown in FIG. 11, connector 64 has a generally horizontal slot 69 accommodating crossbar 67. Crossbar 67 is retained on arm 47 with a pair of screws 71 and 72 that engage opposite ends of crossbar 67, as seen in FIG. 12 whereby piston 63 controls the up and down movements of arm 47. Housing 57 has a passage 73 open to bore 61. Returning to FIG. 11, a nipple 74 threaded into housing 58 has a passage 76 open to passage 73. As seen in FIGS. 11, 13 and 14, a generally cylindrical washer 77 has a relatively small hole 78. Hole 78 restricts the rate of flow of air into and out of the chamber of bore 61. Nipple 74, as seen in FIG. 1, is connected to an air control 79 with a hose 81. Air control mechanism 79 has an air valve operable to control the flow of air into and out of the chamber of bore 61 to control the operation of piston 63 and arm 47 in sequential timed relationship to deposit microchips in sequence on belt 22. Small hole 78 limits the rate of flow of air to and from the chamber of bore 61 thereby providing smooth operation of piston 62 and movement of arm 47.

A transverse drive roller, indicated generally at 82, is rotatably mounted on the upper or forward end of apparatus 20. Roller 82 is operable to sequentially move tube 39 in opposite directions, as indicated by arrow 107 in FIG. 1, in timed relation relative to the up and down movement of feeding arm 47 to sequentially deposit microchips on moving belt 22. Drive roller 82 has a transverse shaft 83 rotatably mounted on bearings 84 and 86 attached to supports 87 and 88. Supports 87 and 88 are upwardly directed extensions or ears of side walls 31 and 32. As seen in FIG. 7, a sleeve 89 is mounted on shaft 83. A plurality of side-by-side O-rings 91 are located about sleeve 89. O-rings 91 are rubber or plastic members having a high friction co-efficient to reduce slippage of roller 82 relative to tube 39. O-rings 91 also support the rear portion of tube 39 slightly above the top inclined surface 30 of top wall 29, as seen in FIG. 7. The portion of tube 39 located under the guide plate 42, is in surface frictional engagement with the inclined surface 30. Tube 39 is positioned in a downwardly and forwardly inclined position so that the microchips slide down tube 39 toward shoulder 48. The inclined position of tube 39 also minimizes backward movement of the microchips in tube 39 when the tube is moved backward to its initial location. Tube 39 can be in a horizontal position.

A stepping motor 93 is operable to selectively rotate the drive roller 82 in opposite directions to sequentially move tube 39 in opposite directions, indicated by arrow 107. Power is transmitted from stepping motor 93 via a belt and pulley or gear drive 92, 94 and 96. Belt 96 is trained about pulleys 92 and 94, as seen in FIG. 7.

Stepping motor 93 is attached to an upright support plate 97 with a plurality of fasteners or bolts 98. The lower portion of support plate 97 is connected to a generally horizontal base plate 99 with bolts 101. Bolts 102 and 103, as seen in FIG. 4, connect base plate 99 to side wall 32. Side wall 32 has a pair of longitudinal slots 104 and 105 that accommodate bolts 102 and 103. Slots 104 and 105 allow the support plate and stepping motor 93 to be longitudinally adjustable relative to the side wall 32, thereby adjusting the tension on belt 96.

Figure 3:
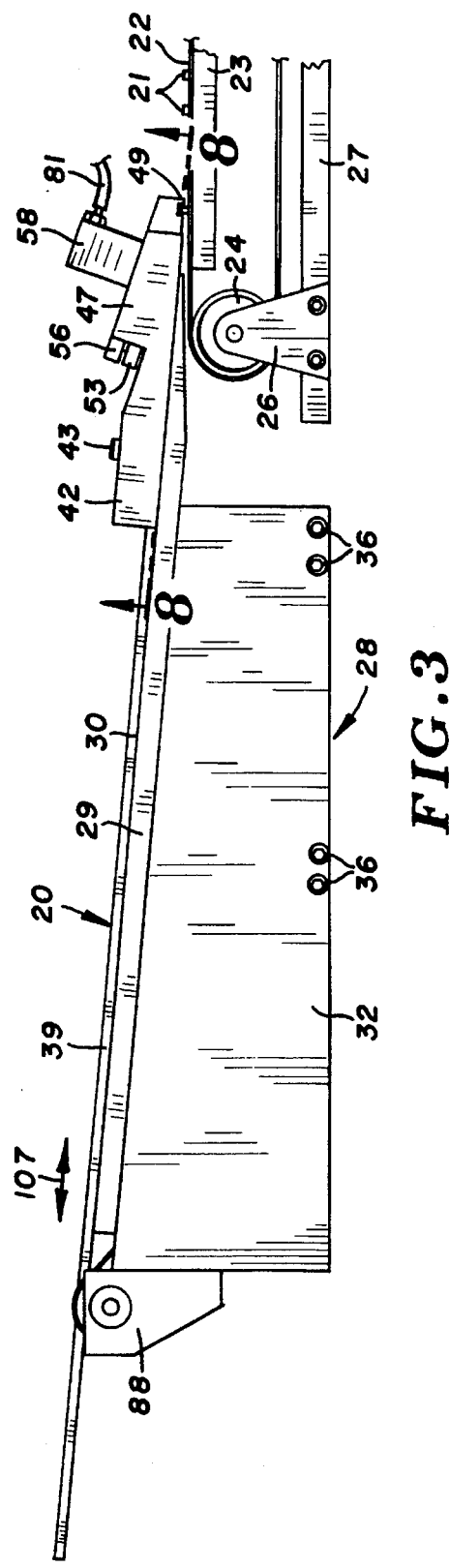
FIG. 3 is a side elevational view of the inertial parts feeding apparatus of FIG. 1.
Figure 9:
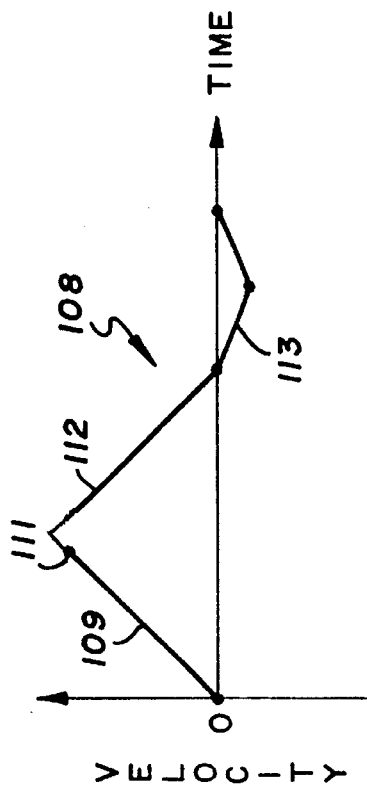
FIG. 9 is a velocity time diagram of the operation of the stepping motor used in the inertial parts feeding apparatus of FIG. 1.
Figure 15:
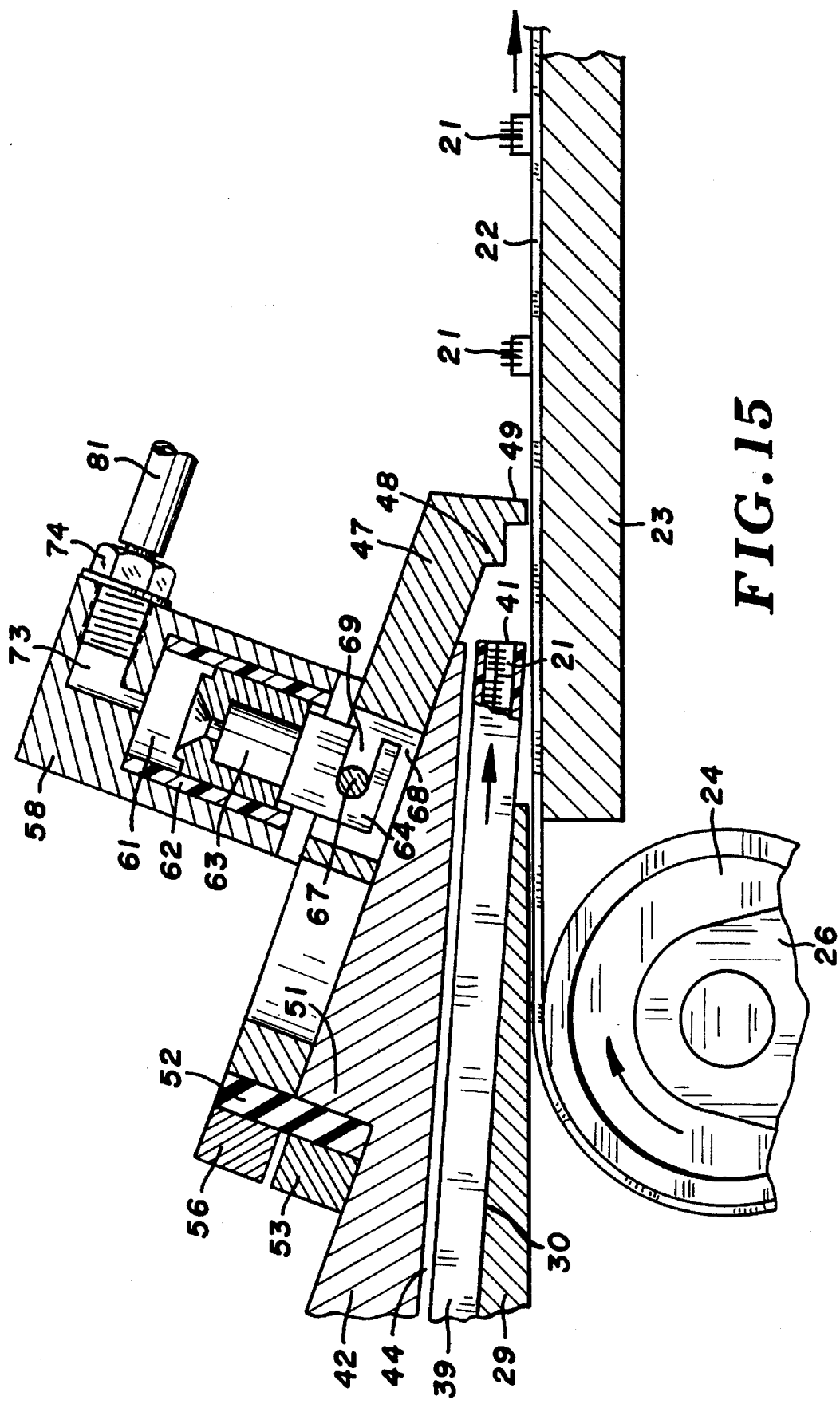
FIG. 15 is an enlarged sectional view of the feeding device on the front end of the inertial parts feeding apparatus shown in FIG. 7.
Figure 16:
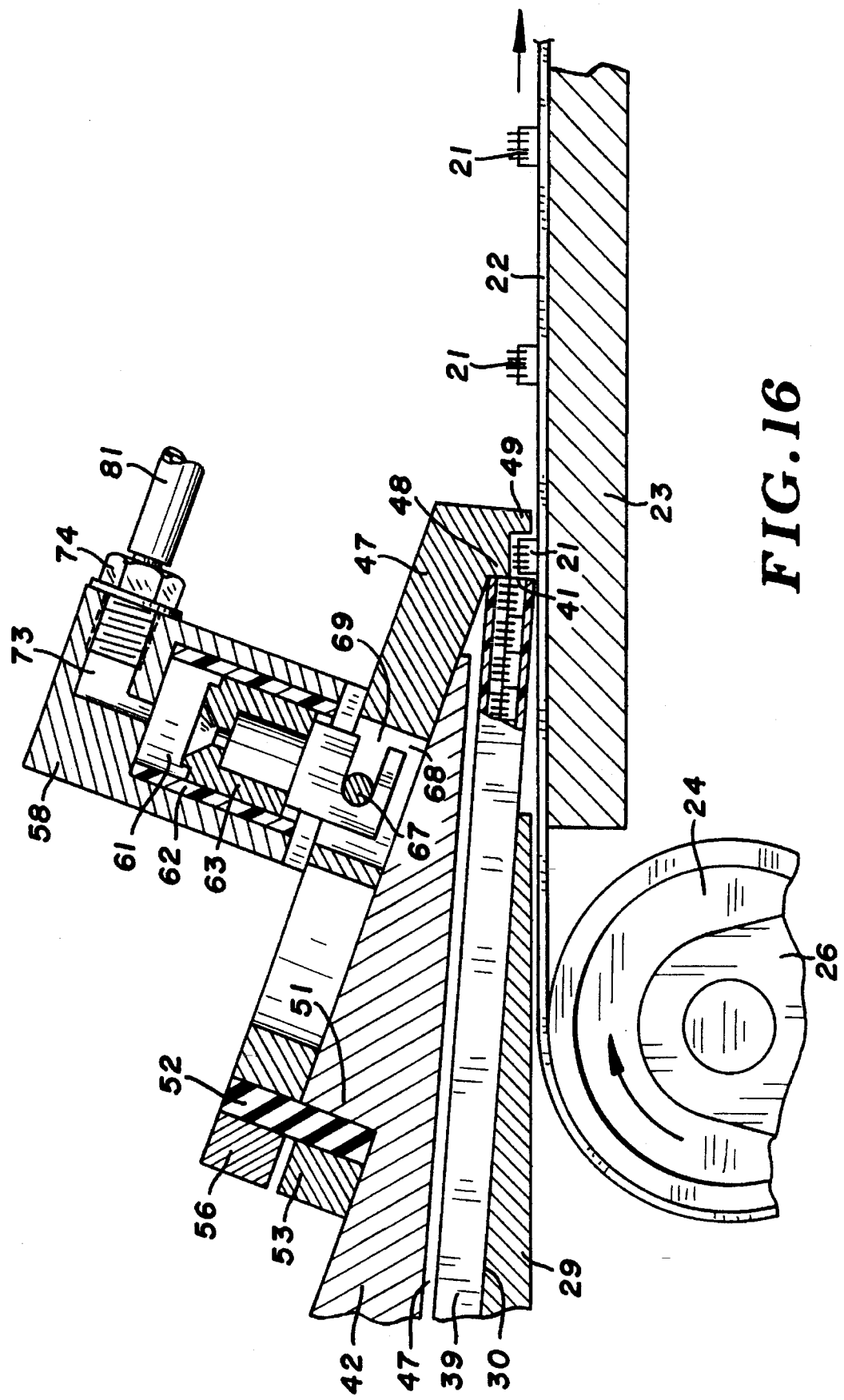
FIG. 16 is a sectional view similar to FIG. 15 showing the dispensing of a microchip from its holding tube onto a moving belt.
Figure 17:
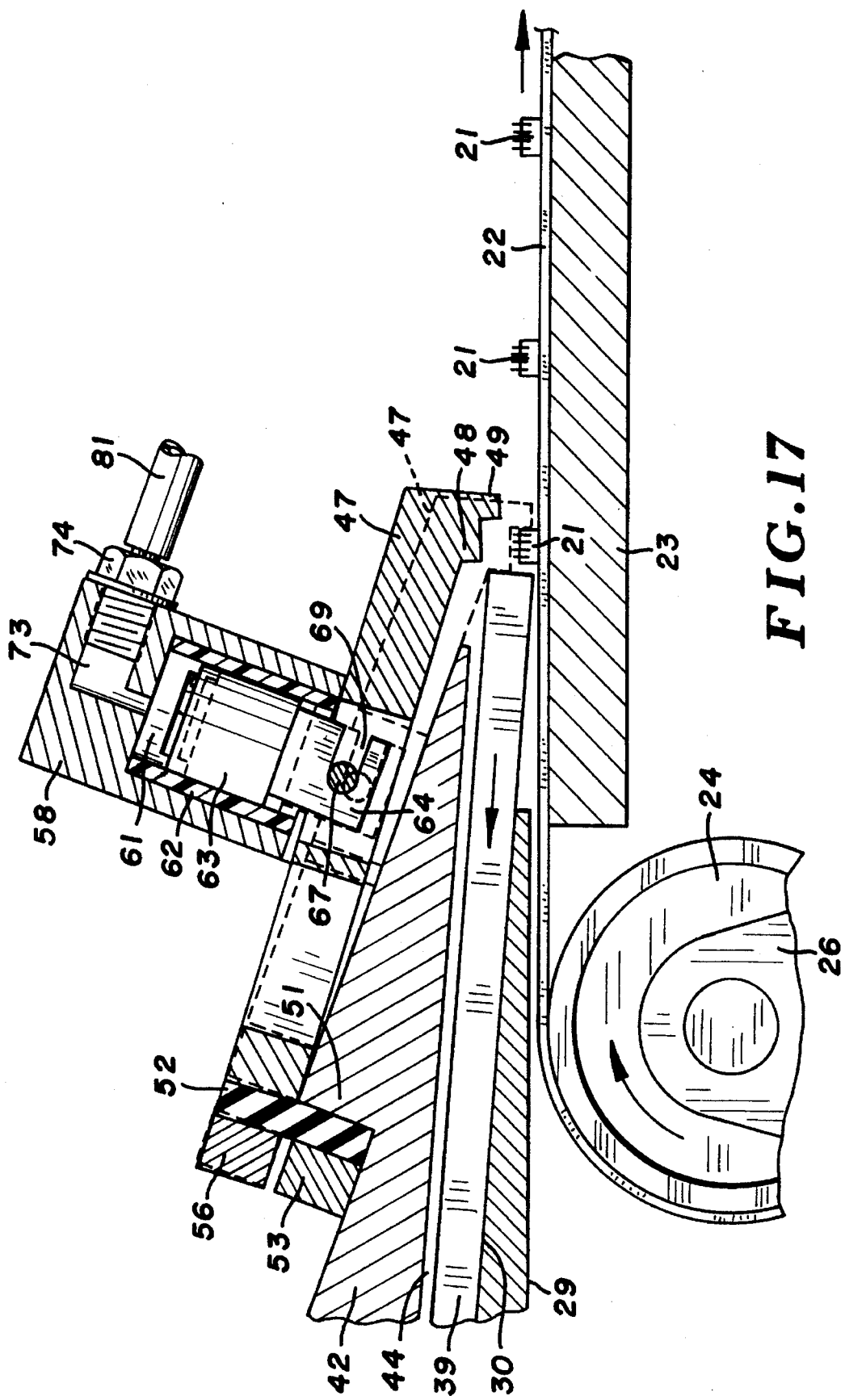
FIG. 17 is a sectional view similar to FIG. 15 showing the part feeding finger in the release position allowing the microchip to move with the conveyor belt.

Referring to FIG. 9, there is shown the velocity-time diagram of the stepping motor, indicated generally at 108. Referring to FIG. 15, tube 39 is initially positioned in a retracted position with end 41 spaced away from shoulder 48. End 41 is open to allow microchip 21 to be deposited on belt 22. Stepping motor 93 is operated a constant acceleration indicated by line 109 until tube end 41 hits shoulder 48, indicated at point 111 in FIG. 9. The microchip moves out of the open end of tube 48 onto belt 22, as seen in FIG. 16. Stepping motor 93 continues to operate a short time and then decelerates at a constant deceleration indicated by line 112 until the velocity is zero. The stepping motor 93 then changes direction to reverse the rotation of roller 82 at a constant acceleration and deceleration as shown by line 113. The reverse movement of roller 82 moves tube 39 back to its original position, as shown in FIG. 15. This position can be changed by increasing the time of reverse operation of the stepping motor. Finger 49 limits the deposit of a single microchip 21 on belt 22, as the space between finger 49 and end 41 will only allow a single microchip to move from tube 39 onto belt 22. During the time that tube 39 is moved back to its initial position, finger 47 is moved in an upward direction by the operation of piston 63. The air control 79 allows a vacuum in the chamber of bore 61 to draw piston 63 in an upward direction so that arm 47 moves against the biasing force of yieldable member 52, thereby allowing microchip 21 to move with belt 22, as shown in FIG. 17. Finger 49 moves along an arc upwardly and away from the microchip whereby finger 49 does not retard the movement of the microchip with belt 22. As soon as the microchip clears finger 49, air control 79 directs air under pressure into the chamber of bore 61 thereby forcing arm 47 in the downward direction until it engages the top of guide plate 42. The biasing force of the yieldable member 52 and the air pressure in the chamber for bore 61 holds arm 47 in its down position, as shown in FIGS. 3, 15 and 16. Stepping motor 93 operates in reverse direction to turn the drive roller 82 in a counter-clockwise direction. Tube 39, being in frictional engagement with the O-rings 91 of the roller 82, pulls tube 39 back to its initial position, as shown in FIG. 15. Feed arm 47 is in its down position wherein shoulder 48 is aligned with the top portion of tube 39.

Inertial parts feeding apparatus 20 incorporates a novel method of dispensing the parts or microchips 21 that are stored in the passage within elongated tube 39 one-by-one onto a moving receiver such as a conveyor belt 22 or providing a tube storing microchips with an open end. The method comprises the steps of opening one end of tube 39 to allow the microchips within the passage of the tube to be dispensed from the tube. Tube 39 is positioned in a first position with the open end 41 thereof spaced from shoulder 48. One end of tube 39 is placed into the guide groove 44 of guide plate 42. The other end of tube 39 is positioned on roller 82 to locate the tube 39 in a forwardly and downwardly inclined location. The friction forces between the microchips and tube is sufficient to retain the microchips in the tube. Tube 39, carrying the microchips, is longitudinally moved at a constant acceleration by rotating roller 82 from the first position to a second position into impact engagement with the face 50 of shoulder 48 with a force so that the first inertia of the microchip in the passage adjacent the end 41 of the tube causes the microchip to move out of the tube and onto moving member 22. The yieldable member 52 and the force of piston 63 biasing arm 47 into engagement with guide plate 42 absorbs some of the impact forces created when tube 39 hits shoulder 48. Yieldable member 52 also allows limited longitudinal movement of arm 47 to reduce the impact force of tube 39 on shoulder 48. The amount of the biasing force of piston 63 is varied to adjust the amount of impact force that is generated when tube 39 hits shoulder 48. The momentum of the microchips in tube 39 causes the microchips to continue to move in the forward direction after the tube hits shoulder 48. The first microchip moves out of the open end 41 of tube 39 into engagement with finger 49. The longitudinal space between the face 50 of shoulder 49 and the front of finger 49 accommodates only one microchip so that the remaining microchips are retained in tube 39. Tube 39 is guided for longitudinal movement from the first position to the second position and back to the first position along the groove in guide plate 42. The acceleration of tube 39 is constant as the velocity is linearly increased by the operation of stepping motor 93 during the movement of tube 39 from the first position to the second position. Stepping motor 93 continues to operate to attempt to accelerate the tube 39 thereby holding tube 39 against stop 48. Motor 93 then decelerates, shown by line 112 in FIG. 9, and subsequently reverses operation, shown by line 113, until tube 39 returns to its original position. The distance that tube 39 travels determines its impact force on stop 48. The longer the distance of travel of tube 39 to stop 48, the greater the impact force on stop 48. This allows the apparatus to handle different types and sizes of microchips by adjusting the operation of stepping motor 93. Forward movement of the first microchip on the moving member 22 is limited with the finger 49. Finger 49 also only allows one microchip to be dispensed from tube 39 each time the tube impacts against the face 50 of shoulder 48. Finger 49 is released from the microchip to allow the microchip to move with moving member 22. Air control 79 directed a vacuum air pressure to bore 61 so that piston 66 moves up to pivot arm 47 upwardly away from guide plate 42 whereby finger 49 moves upwardly and away from the microchip on belt 22. Tube 39 is then moved back from the second position to the first position by reversing the operation of the stepping motor 93. The inertial parts feeding apparatus 20 is now in a position to dispense a second microchip onto moving belt 22.

While there has been shown and described one embodiment of the inertial parts feeding apparatus and a method of dispensing parts, such as microchips, onto a moving member, it is understood that changes in the materials, structures, arrangement of structures and use of the impact apparatus may be made by those skilled in the art without departing from the invention. The invention is defined in the following claims.

I claim:

1. An apparatus for dispensing microchips stored in an elongated passage in a linear tube having an open end onto a moving member comprising: a housing having a top wall, said top wall having a first end and a second end, an arm having a shoulder and a stop finger located adjacent the moving member, guide means having a groove for accommodating a portion of said tube mounted on the second end of the top wall, means mounting the arm on the guide means for movement between a first position locating the finger adjacent the moving member to hold a microchip on the moving member, and longitudinally aligning the groove with the shoulder, roller means mounted on the housing adjacent the first end of the top wall adapted to engage the tube and support a first portion of the tube above the top wall of the housing when a second portion of the tube is located in said groove, motor means driveably connected to the roller means, said motor means being operable to selectively drive the roller means in opposite directions thereby moving the tube in a first direction whereby the tube impacts against the shoulder and a microchip moves out of the passage in the tube through the open end thereof onto the moving member and is retained thereon by the stop finger, and moving the tube in a second direction away from said shoulder after the microchip has moved out of the tube, and means for moving the arm from the second position to the first position to release the microchip on the moving member for movement with the moving member and moving the arm from the first position to the second position to locate the finger adjacent the moving member after the microchip on the member has moved away from the finger.

2. The apparatus of claim 1 wherein: the shoulder has an upright face aligned with the groove adapted to be engaged by the open end of the tube, said stop finger extended downwardly from said shoulder and rearwardly of said face.

3. The apparatus of claim 2 wherein: the motor means is a stepping motor, and power transmitting means driveably connecting the motor with the roller means, said motor being operable to selectively rotate the roller means in opposite directions thereby moving the tube in the first and second directions.

4. The apparatus of claim 1 wherein: the groove of the guide means is open to said top wall of the housing whereby the portion of the tube located within said groove engages said top wall.

5. The apparatus of claim 1 wherein: the means mounting the arm on the guide means includes yieldable hinge means operable to permit limited longitudinal movement of the arm when the tube impacts upon the shoulder and allows movement of the arm between its first and second positions.

6. The apparatus of claim 5 wherein: the yieldable hinge means is an elastic member, first means connecting the elastic member to the guide means, and second means connecting the elastic member to the arm.

7. The apparatus of claim 6 wherein: the means for moving the arm comprises a housing member extended transversely across the arm and mounted on the guide means, said housing member having a bore open adjacent said arm, piston means slideably located within said bore, means connecting the piston means with the arm, and means operable to control the flow of fluid under pressure to and from said bore thereby moving said piston means relative to the housing member and moving the arm between its first and second positions.

8. The apparatus of claim 1 wherein: the guide means has a longitudinal groove accommodating the arm and an inclined surface extended along the bottom of the groove, said arm being located in engagement with said inclined surface when the arm is in its first position.

9. The apparatus of claim 1 wherein: the roller means includes a transverse sleeve, friction means mounted on the sleeve, said tube being engageable with said friction means whereby rotation of the roller means moves the tube relative to the housing and arm.

10. The apparatus of claim 9 wherein: the friction means comprises a plurality of side-by-side O-rings.

11. The apparatus of claim 1 wherein: the means for moving the arm comprises a piston and cylinder assembly connected to the arm operable in response to fluid pressure to move the arm between its first and second positions.

12. An apparatus for dispensing parts stored in a passage in a tube having an open end onto a moving member comprising: a housing, an arm having a shoulder and a stop finger located adjacent the moving member, guide means mounted on the housing for directing the tube toward the shoulder, means mounting the arm on the guide means for movement between a first position locating the finger adjacent the moving member to hold the part on the moving member, and a second position locating the finger above the moving member thereby releasing the part for movement with the moving member, roller means mounted on the housing adapted to engage the tube and move the tube in opposite directions, motor means operatively connected to the roller means operable to selectively rotate the roller means in opposite directions thereby moving the tube in a first direction whereby the tube impacts against the shoulder and a part moves out of the open end of the tube onto the moving member and is retained thereon by the stop finger, and moving the tube in a second direction away from said shoulder after the part has moved out of the tube, and means for moving the arm from the first position to the second position to release the part on the moving member for movement with the moving member and moving the arm from the second position to the first position to locate the finger adjacent the moving member.

13. The apparatus of claim 12 wherein: the shoulder has an upright face aligned with the open end of the tube, said stop finger extended downwardly from said shoulder and rearwardly of said face.

14. The apparatus of claim 12 wherein: the guide means has a longitudinal groove open to said top wall of the housing whereby a portion of the tube is located in said groove in engagement with said top wall.

15. The apparatus of claim 12 wherein: the means mounting the arm on the guide means includes yieldable hinge means operable to permit limited longitudinal movement of the arm when the tube impacts on the shoulder and allow movement of the arm between its first and second positions.

16. The apparatus of claim 15 wherein: the yieldable hinge means is an elastic member, a first means connecting the elastic member to the guide means, and second means connecting the elastic member to the arm.

17. The apparatus of claim 16 wherein: the means for moving the arm comprises a housing member extended transversely across the arm and mounted on the guide means, said housing member having a bore open adjacent said arm, piston means slideably located within said bore, means connecting the piston means with the arm, and means operable to control the flow of fluid under pressure to and from said bore thereby moving said piston means relative to the housing member and moving the arm between its first and second positions.

18. The apparatus of claim 12 wherein: the guide means has a longitudinal groove accommodating the arm and an inclined surface extended along the bottom of the groove, said arm being located in engagement with said inclined surface when the arm is in its first position.

19. The apparatus of claim 12 wherein: the roller means includes a transverse sleeve and friction means mounted on the sleeve, said tube being engageable with said friction means whereby rotation of the roller means moves the tube relative to the frame and arm.

20. The apparatus of claim 19 wherein: the friction means comprise a plurality of side-by-side O-rings.

21. The apparatus of claim 12 wherein: the motor means is a stepping motor, and power transmitting means driveably connecting the motor with roller means, said motor being operable to selectively rotate the roller means in opposite directions thereby moving the tube in the first and second directions.

22. The apparatus of claim 12: the means for moving the arm comprises a piston and cylinder assembly connected to the arm operable in response to fluid pressure to move the arm between its first and second positions.

23. The apparatus of claim 12 wherein: said housing has a top surface inclined downwardly and forwardly toward said arm, said tube, when associated with the guide means being in engagement with at least part of said top surface.

24. An apparatus for dispensing parts stored in a tube having an open end onto a receiver comprising: a housing, an arm having first stop means engageable with the tube and second stop means for retaining a part on the receiver, guide means for directing the tube toward the first stop means, first means mounting the arm on the guide means for movement between a first position locating the second stop means adjacent the receiver to hold a part on the receiver and a second position locating the second stop means above the receiver and a second position locating the second stop means above the receiver thereby releasing the part on the receiver, second means mounted on the housing adapted to engage the tube and move the tube in opposite longitudinal directions, power means operatively connected to the second means for moving the second means to selectively move the tube in a first direction whereby the tube impacts against the first stop means and a part moves out of the open end of the tube onto the receiver and is retained thereon by the second stop means and in a second direction away from the first stop means after the part has moved out of the tube, third means for moving the arm from the first position to the second position to release the part on the receiver and moving the arm from the second position to the first position to locate the second stop means adjacent the receiver.

25. The apparatus of claim 24 wherein: the guide means has a longitudinal groove for accommodating a portion of the tube, said first stop means has an upright face aligned with the groove adapted to be engaged by the open end of the tube, said second stop means extended downwardly from said first stop means and rearwardly of said face.

26. The apparatus of claim 24 wherein: the first means mounting the arm on the guide means includes yieldable hinge means operable to permit limited longitudinal movement of the arm when the tube impacts on the first stop means and allow movement of the arm between its first and second positions.

27. The apparatus of claim 26 wherein: the yieldable hinge means is an elastic member, first connecting means attaching the elastic member to the guide means, and second connecting means attaching the elastic member to the arm.

28. The apparatus of claim 24 wherein: the third means for moving the arm comprises a housing member extended transversely across the arm and mounted on the guide means, said housing member having a bore open adjacent said arm, piston means slideably located within said bore, means connecting the piston means with the arm and means operable to control the flow of fluid under pressure to and from said bore thereby moving said piston means relative to the housing member and moving the arm between its first and second positions.

29. The apparatus of claim 24 wherein: the second means comprises roller means having a transverse sleeve and friction means mounted on the sleeve, said tube being engageable with said friction means thereby rotating the roller means to move the tube relative to the housing and arm.

30. The apparatus of claim 24 wherein: the power means is a stepping motor and power transmitting means driveably connecting the motor with the second means whereby said motor is operable to selectively move the second means in an opposite direction thereby moving the tube in its first and second directions.

31. The apparatus of claim 24 wherein: the third means for moving the arm comprises a piston and cylinder assembly connected to the arm operable in response to fluid pressure to move the arm between its first and second positions.

32. The apparatus of claim 24 wherein: said housing has a top surface inclined downwardly and forwardly toward said arm, said tube, when associated with the guide means, being in engagement with at least a part of said top surface.

33. A method for dispensing parts stored in a passage within an elongated tube onto a moving member comprising: opening one end of the tube to allow parts within the passage to be dispensed from the tube, positioning the tube in a first position with the one end thereof spaced from a shoulder, moving the tube from the first position to a second position into impact engagement with the shoulder with a force so that a part in the passage adjacent the end of the tube moves out of the tube and onto the moving member, holding the part on the moving member, releasing the part for movement with the moving member, and moving the tube from the second position back to the first position.

34. The method of claim 33 wherein: the tube is positioned in longitudinal alignment with the shoulder whereby said tube is moved longitudinally into impact engagement with the shoulder.

35. The method of claim 33 including: guiding the tube for longitudinal movement from the first position to the second position and back to the first position.

36. The method of claim 33 wherein: the rate of movement of the tube is linearly increased during movement of the tube from the first position to the second position.

37. A method of sequentially dispensing parts stored in a passage within an elongated tube having an open end onto a moving receiver comprising: positioning the tube in a first position with the open end thereof spaced from a stop member located above the moving receiver, moving the tube from the first position to a second position into impact engagement with the stop member with a force so that a part in the passage adjacent the open end of the tube moves out of the tube and onto the moving receiver holding the part on the moving receiver, releasing the part for movement with the moving receiver, and moving the tube from the second position back to the first position.

38. The method of claim 37 wherein: the tube is positioned in a downwardly and forwardly inclined first position.

39. The method of claim 37 wherein: the tube is positioned in longitudinal alignment with the stop member whereby the tube is moved longitudinally into impact engagement with the stop member.

40. The method of claim 37 including: guiding the tube for longitudinal movement from the first position to the second position and back to the first position.

41. The method of claim 37 wherein: the rate of movement of tube is linearly increased during movement of the tube from the first position to the second position.

* * * * *